(12) United States Patent
Ziger

(10) Patent No.: US 6,716,649 B2
(45) Date of Patent: *Apr. 6, 2004

(54) METHOD FOR IMPROVING SUBSTRATE ALIGNMENT

(75) Inventor: David H. Ziger, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/117,924

(22) Filed: Jun. 17, 2002

(65) Prior Publication Data

US 2003/0104640 A1 Jun. 5, 2003

Related U.S. Application Data

(63) Continuation-in-part of application No. 09/826,839, filed on Apr. 6, 2001, now Pat. No. 6,613,589.

(51) Int. Cl.[7] .............................................. H01L 438/14
(52) U.S. Cl. ........................................................ 438/14
(58) Field of Search ..................................... 438/14, 18

(56) References Cited

U.S. PATENT DOCUMENTS 5,995,234 A * 11/1999 Nishi .......................... 356/401
2003/0005405 A1 * 1/2003 Ziger ........................... 716/21

* cited by examiner

*Primary Examiner*—Hoai Ho
*Assistant Examiner*—Quoc Hoang
(74) *Attorney, Agent, or Firm*—Peter Zawilski

(57) ABSTRACT

A method for improving substrate alignment on a stepper comprises imposing predetermined corrections on each of a plurality of substrates, a different set of corrections for each substrate. The actual corrections occurring on the substrates are measured and mathematically processed to produce a matrix and a plurality of equations. The equations are resolved to provide correct corrections for accurate alignment.

9 Claims, 6 Drawing Sheets a b a b

METHOD FOR IMPROVING SUBSTRATE ALIGNMENT

PRIORITY OF EARLIER FILED APPLICATIONS

This application is a continuation-in-part of application Ser. No. 09/826,839 filed on Apr. 6, 2001 now U.S. Pat. No. 6,613,589 issued on Sep. 2, 2003.

BACKGROUND OF THE INVENTION

This invention relates to the improvement of substrate alignment, for example in the manufacture of semiconductor circuits.

The manufacture of semiconductor circuits requires that patterned layers be aligned to specific underlying features. The amount of misalignment is readily measurable, using commercially available instruments and procedures. It is desirable to minimize misalignment.

As is well known, photolithography methods have been used for patterning a resist layer on a semiconductor wafer to form integrated circuits (ICs) such as processors, ASICs and Dynamic Random Access Memory (DRAM). As dimensions of features within the ICs on the semiconductor wafer become smaller, repeatable accurate photolithography methods become more important.

Presently, one of the most conventional photo lithography methods used is a stepper, a step-and-repeater, which moves and aligns a wafer based on alignment marks on a reticle containing an image such that desired patterns on the wafer are exposed based on the image. The stepper includes a radiation lamp for generating radiation, an imaging lens, a reticle stage for mounting and moving the reticle and a wafer stage for loading the wafer. In the stepper, after the wafer is loaded on the wafer stage, the reticle stage searches and moves to a predetermined position to form a chip, thereby implementing an alignment process. Thereafter, amounts of misalignment errors such as X misregistration, Y misregistration, rotation and orthogonal errors are measured to accurately position the reticle stage at the predetermined position. In the next step, the radiation from the radiation lamp propagates to the imaging lens after passing through the reticle. The wafer is exposed by the radiation from the imaging lens by moving the wafer stage until the entire of the wafer is scanned. A number of successive steps of photolithography, film growth, deposition and implantation of impurities create a complete IC with many identical copies or chips on a same wafer.

Prior art exposure tools, such as a stepper, typically allow measured corrections to be entered so that alignment is improved on subsequent wafers. For example, a measured error is entered as a correction and the stepper is instructed to correct subsequent wafers by the measured inaccuracy. As such, stepper alignment corrections are typically made by measuring the alignment and reversing the measured component offsets. For example, depending on conventions used for a particular stepper or lithographic layer, engineers know to input the measured parameter or to reverse the sign.

There exists a problem in that one correction can interact with another, and also the response to a correction may be some fraction of the actual programmed value.

SUMMARY OF THE INVENTION

Broadly, the invention is to a method for improving alignment of a substrate on a stepper, comprising the steps of imposing predetermined corrections for each of a plurality of substrates, a set of corrections for each substrate, measuring the actual corrections which occur on each substrate, mathematically processing the actual corrections to produce a matrix and provide a plurality of equations, and resolving the equations to provide a set of input corrections to provide a correct alignment.

BRIEF DESCRIPTION OF THE DRAWINGS

The invention will now be described with reference to the attached drawings in which.

DESCRIPTION OF A PREFERRED EMBODIMENT

Figure 1:
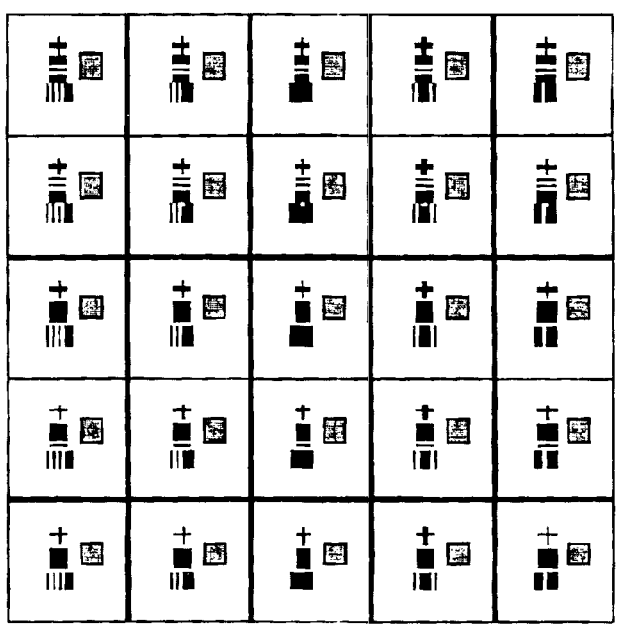
FIG. 1 shows distortion free calibration wafers fabricated by micro stepping over a complete wafer the centre die of a 5×5 reticle field. Each subfield contains all the required marks to align a second pattern to it.
Figure 1:
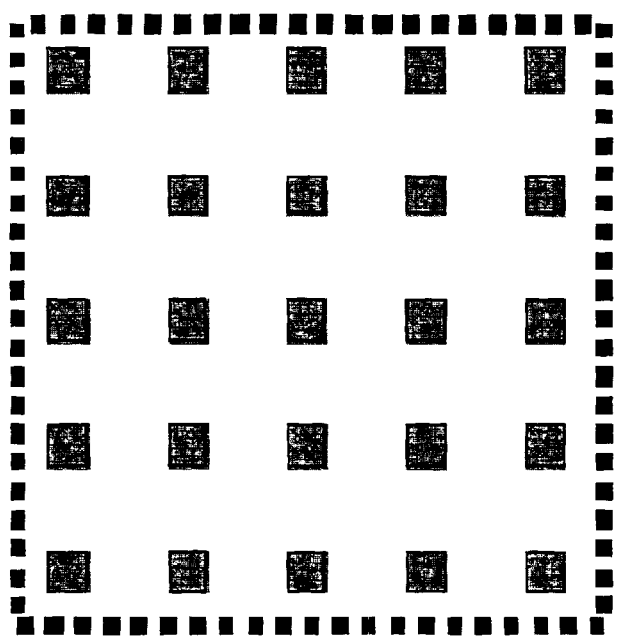

In the disclosure that follows, the following terms are used to have the following meanings:

The job entry screen is an input screen wherein an operator, prior to beginning wafer processing job, enters data specific to said job. Typically, the data entry fields include such information as a number of wafers to process and a process to use. Further, data may be enterable relating to focus, alignment, etc. All entered data is used for the one process in isolation.

The maintenance entry screen is an input screen wherein a maintenance user is able to change offsets used by the system for preventative maintenance. The change is more global in nature and not job specific.

A job run is a single process for processing wafers in a similar fashion initiated from a job entry screen.

Of course, in using other wafer processing systems, different terms or different contents of user interface screens and different options are available. These differences do not significantly affect the working of the present invention. These wafer processing systems are often computer-controlled. Consequently, information as obtained from the present invention, may be stored in computer-readable media therein. The computer readable media may include, but is not limited, to memory, magnetic and optical media, and remote storage on a network, etc.

The vast body of prior art highlights work towards modeling overlay data allowing for determination of measured errors. Unfortunately, as noted above, sometimes, knowing the error does not result in an accurate correction. In fact, even when accurate correction values are provided to a stepper, non-negligible errors result in the corrective stepper movement. It has now been found that quantification of the effect of correctables on alignment is useful to reduce these non-negligible errors.

The present invention is concerned with improving the pattern alignment, i.e., reduce the pattern misalignment by calibrating the stepper and measuring component responses. These responses are regressed and input into a response matrix. The response matrix is then used to predict the required component offsets by solving the relevant set of linear equations.

For example, assuming that a linear model adequately describes misalignment over a wafer and field, for a Canon EX4 stepper, a potential model is given by Eqs. 1a and 1b:

$$R_x = R_{x0} + R_{xChipMag}x_{chip} + R_{xChipRot}x_{chip} + R_{xWMag}x_{wafer} + R_{yWRot}x_{wafer} \quad (1a)$$

$$R_y = R_{y0} + R_{yChipMag}y_{chip} + R_{yChipRot}y_{chip} + R_{yWMag}y_{wafer} + R_{xWRot}y_{wafer} \quad (1b)$$

where $R_x$ and $R_y$ are misalignment in the horizontal and vertical directions, respectively, and the definitions for the first order coefficients are shown in Table 1. $X^{input}$, the set of input corrections for use with a Canon EX4 steppers is given by:

$$X^{input} = \begin{pmatrix} R_{x0} \\ R_{y0} \\ R_{ChipMag} \\ R_{ChipRot} \\ R_{xWMag} \\ R_{yWMag} \\ R_{xWRot} \\ R_{yWRot} \end{pmatrix}^{input} \quad (2)$$

Furthermore, the measurable components of alignment resulting from providing $X^{input}$ is $X^{result}$:

$$X^{result} = \begin{pmatrix} R_{x0} \\ R_{y0} \\ R_{ChipMag} \\ R_{ChipRot} \\ R_{xWMag} \\ R_{yWMag} \\ R_{xWRot} \\ R_{yWRot} \end{pmatrix}^{result} \quad (3)$$

When the stepper moves exactly in accordance with $X^{input}$, an ideal case, the value of $X^{result}$ is equal to $X^{input}$. For any value of $X^{result}$, a transformation matrix T exists such that:

$$X^{result} = TX^{input} \quad (4)$$

Note that for the ideal case in which all correction input values exactly correspond to the resulting corrections T is the identity matrix. Off diagonal elements denote interactions between different correctable components. Diagonal elements that vary from unity quantify responses that correspond other than exactly in sign and/or magnitude to their associated input value. Using this notation, the desired input vector, $X^{input}$, that when provided results in approximately no misalignment—it effectively zeroes out the regressed components of a measured misalignment—is:

$$X^{input} = -T^{-1}X^{result} \quad (5)$$

Where the minus sign is indicative of the fact that to correct for an error, intuitively, a negative of the error amount is used. Of course this is merely convention and the negative could be included within the matrix $T^{-1}$.

Therefore, once T is determined, the vector of input correction values is determinable provided that an inverse of T, $T^{-1}$, exists. A simple but general method for determining T is to intentionally misalign a set of calibration wafers with predetermined input corrections and to regress their effect on the resulting alignment components. Suppose a series of calibration wafers are exposed with a balanced set of predetermined offsets according to a design methodology and resulting alignment components are extracted from each wafer. Consider the correctables outlined in Table 1.

TABLE 1

| Component | Symbol | Definition |
|---|---|---|
| x, y Translation Error | $R_{x0}, R_{y0}$ | Zeroith order misalignment, normally calculated from the average misalignment |
| Average Chip Magnification | $R_{ChipMag}$ | $Av\left(\dfrac{\partial R_x}{\partial x_{Chip}}, \dfrac{\partial R_y}{\partial y_{Chip}}\right)$ |
| Average Chip Rotation | $R_{ChipRot}$ | $Av\left(\dfrac{\partial R_x}{\partial y_{Chip}}, \dfrac{\partial R_y}{\partial x_{Chip}}\right)$ |
| x Wafer Magnification | $R_{xWafMag}$ | $\dfrac{\partial R_x}{\partial x_{Wafer}}$ |
| y Wafer Magnification | $R_{yWafMag}$ | $\dfrac{\partial R_y}{\partial y_{Wafer}}$ |
| x Wafer Rotation | $R_{xWafRot}$ | $\dfrac{\partial R_y}{\partial x_{Wafer}}$ |
| y Wafer Rotation | $R_{yWafRot}$ | $\dfrac{\partial R_x}{\partial y_{Wafer}}$ |

Eight (8) or more independent input conditions are used to determine the elements of T that effect each alignment component shown in Table 1. For example, the row of T affecting $R_{yWafRot}$ is found from regressing the set of equations of the form shown in Eq. 6 where i denotes the $i^{th}$ characterization condition:

$$R_{yWafRot}^{resulti} = R_{x0}^{inputi}T_{8,1} + R_{y0}^{inputi}T_{8,2} + R_{ChipMag}^{inputi}T_{8,3} + R_{ChipRot}^{inputi}T_{8,4} + \\ R_{xWafMag}^{inputi}T_{8,5} + R_{yWafMag}^{inputi}T_{8,6} + R_{xWafRot}^{inputi}T_{8,7} + R_{yWafRot}^{inputi}T_{8,8} \quad (6)$$

Once the components of T are found, other effects are optionally considered. For example, if the calibration wafers print a frame into an existing outer frame but specific layers or technologies do the converse, then this is accounted for by reversing the sign of the correction vector.

A solution to the problem arising from the interrelations, or interactions, of the alignments can be obtained as follows.

According to the invention the response of a stepper to known, forced, offsets is statistically calibrated. An example of such a calibration is shown in Table 2, which characterizes the effect of the eight (8) corrections on alignment.

TABLE 2

| Run | $R_{x0}$ | $R_{y0}$ | $R_{ChipMag}$ | $R_{ChipRot}$ | $R_{xWafRot}$ | $R_{yWafRot}$ | $R_{xWafMag}$ | $R_{yWafMag}$ |
|---|---|---|---|---|---|---|---|---|
| 1 | 0.07 | −0.07 | −4 | 4 | 2 | −2 | 2 | −2 |
| 2 | −0.07 | −0.07 | 4 | 4 | −2 | −2 | 2 | 2 |
| 3 | 0 | 0 | 0 | 0 | 0 | 0 | 0 | 0 |
| 4 | −0.07 | 0.07 | 4 | −4 | −2 | 2 | −2 | 2 |
| 5 | −0.07 | −0.07 | −4 | −4 | 2 | 2 | 2 | 2 |
| 6 | 0.07 | 0.07 | −4 | −4 | 2 | 2 | −2 | −2 |
| 7 | −0.07 | 0.07 | 4 | −4 | 2 | −2 | 2 | −2 |
| 8 | 0.07 | −0.07 | 4 | −4 | 2 | −2 | −2 | 2 |
| 9 | 0.07 | 0.07 | −4 | −4 | −2 | −2 | 2 | 2 |
| 10 | 0.07 | 0.07 | 4 | 4 | −2 | −2 | −2 | −2 |
| 11 | −0.07 | −0.07 | −4 | −4 | −2 | −2 | −2 | −2 |
| 12 | 0 | 0 | 0 | 0 | 0 | 0 | 0 | 0 |
| 13 | −0.07 | 0.07 | −4 | 4 | 2 | −2 | −2 | 2 |
| 14 | −0.07 | −0.07 | 4 | 4 | 2 | 2 | −2 | −2 |
| 15 | 0.07 | −0.07 | 4 | −4 | −2 | 2 | 2 | −2 |
| 16 | 0.07 | −0.07 | −4 | 4 | −2 | 2 | −2 | 2 |
| 17 | 0.07 | 0.07 | 4 | 4 | 2 | 2 | 2 | 2 |
| 18 | 0 | 0 | 0 | 0 | 0 | 0 | 0 | 0 |
| 19 | −0.07 | 0.07 | −4 | 4 | −2 | 2 | 2 | −2 |

Table 2 shows an example of a series of characterization runs used to calibrate the effect of eight independent stepper variables (x-translation, y-translation, chip magnification, chip rotation, x wafer magnification, y wafer magnification, x wafer rotation and y wafer rotation). The eight alignment variables are varied from low to high values along with replicates at baseline conditions in which the corrections are set to zero.

TABLE 3

| Run | $R_{x0}$ | $R_{y0}$ | $R_{ChipMag}$ | $R_{ChipRot}$ | $R_{xWafMag}$ | $R_{yWafMag}$ | $R_{xWafRot}$ | $R_{yWafRot}$ |
|---|---|---|---|---|---|---|---|---|
| 1 | −0.08 | 0.07 | 3.63 | −6.06 | −2.08 | 2.16 | 2.03 | 1.77 |
| 2 | 0.10 | 0.07 | −2.80 | −2.86 | −1.66 | −1.79 | 2.08 | −2.01 |
| 3 | 0.02 | −0.01 | 0.69 | −0.79 | 0.06 | 0.13 | 0.11 | −0.04 |
| 4 | 0.06 | −0.07 | −3.04 | 4.95 | 1.96 | −1.95 | −1.87 | −1.87 |
| 5 | 0.09 | 0.06 | 4.30 | 1.36 | −1.96 | −1.98 | −1.85 | 1.95 |
| 6 | −0.07 | −0.07 | 4.10 | 1.40 | 1.79 | 2.08 | −1.85 | 1.98 |
| 7 | 0.08 | −0.07 | −2.98 | 1.20 | −1.71 | 2.12 | 2.17 | 1.97 |
| 8 | −0.05 | 0.07 | −3.22 | 0.94 | 2.17 | −1.92 | 2.07 | 2.03 |
| 9 | −0.08 | −0.07 | 4.55 | 5.20 | −2.18 | −1.91 | 2.04 | −1.82 |
| 10 | −0.06 | −0.08 | −3.19 | −2.93 | 2.06 | 2.18 | 2.12 | −2.02 |
| 11 | 0.06 | 0.07 | 4.34 | 4.88 | 1.75 | 2.12 | 2.17 | −1.84 |
| 12 | 0.01 | 0.00 | 0.68 | −0.87 | 0.01 | 0.02 | 0.21 | 0.02 |
| 13 | 0.10 | −0.07 | 4.17 | −6.68 | 2.02 | −1.85 | 2.16 | 1.67 |
| 14 | 0.08 | 0.07 | −3.33 | −6.71 | 2.21 | 2.13 | −1.85 | 1.66 |
| 15 | −0.04 | 0.07 | −2.93 | 4.77 | −1.65 | 2.11 | −1.91 | −1.86 |
| 16 | −0.07 | 0.07 | 4.33 | −2.66 | 1.69 | −1.95 | −1.87 | −2.07 |
| 17 | −0.06 | −0.08 | −2.89 | −6.49 | −1.76 | −1.93 | −1.92 | 1.77 |
| 18 | 0.03 | 0.00 | 0.65 | −1.07 | 0.00 | 0.10 | 0.14 | 0.00 |
| 19 | 0.06 | −0.06 | 4.54 | −2.54 | −2.09 | 2.19 | −1.89 | −2.01 |

The alignment resulting from each of the runs shown in Table 3 is analyzed and decomposed into the alignment components as shown in Table 4. Note that the values in Table 3 do not match the values given in Table 2. Some values are nearly the opposite, others are nearly the same and still others are neither.

Standard regression is performed on each column of data from table 3. The data is taken column by column and regressed with the data from Table 2. Here the data from table 3 forms the response values and the data from column 2 forms the x values—the conditions. The result is, coefficients that are then analysed for significance. Those that are significant populate a first row of the resulting transformation matrix. A same process is performed for each subsequent column in order to populate subsequent rows of the transformation matrix. The resulting matrix is square (here it is 8×8).

TABLE 4

| | Result | | | | | | | | | Input | |
|---|---|---|---|---|---|---|---|---|---|---|---|
| $R_{x0}$ | = | −1.017 | 0.000 | 0.002 | 0.000 | 0.000 | 0.000 | 0.000 | 0.000 | $R_{x0}$ | (1) |
| $R_{y0}$ | | 0.000 | −1.010 | 0.000 | 0.000 | 0.000 | 0.000 | 0.000 | 0.000 | $R_{y0}$ | |

TABLE 4-continued

| Result | | | | | | | | | Input |
|---|---|---|---|---|---|---|---|---|---|
| $R_{ChipMag}$ | 0.000 | 0.000 | — 0.911 | 0.000 | 0.000 | 0.000 | — 0.064 | 0.000 | $R_{ChipMag}$ |
| $R_{ChipRot}$ | 0.000 | 0.000 | — 0.031 | — 0.963 | 0.000 | 0.000 | — 0.926 | 0.000 | $R_{ChipRot}$ |
| $R_{xWafMag}$ | 0.000 | 0.000 | 0.042 | 0.000 | −0.961 | 0.000 | 0.000 | 0.000 | $R_{xWafMag}$ |
| $R_{yWafMag}$ | 0.000 | 0.000 | 0.000 | 0.000 | 0.000 | −1.011 | 0.000 | — 0.013 | $R_{yWafMag}$ |
| $R_{xWafRot}$ | 0.000 | 0.000 | 0.000 | 0.000 | 0.000 | 0.000 | 0.000 | — 0.995 | $R_{xWafRot}$ |
| $R_{yWafRot}$ | 0.000 | 0.000 | 0.000 | — 0.026 | 0.000 | 0.000 | 0.949 | 0.000 | $R_{yWafRot}$ |

The interactions of the various correlations are evident. In particular, the measured chip rotation, as a function of the input corrections, is given by:

$$R_{ChipRot}^{result} = -0.031 \times R_{ChipMag}^{input} - 0.963 \times R_{ChipRot}^{input} - 0.926 \times R_{xWafRot}^{input} \quad (6)$$

The response to the programmed correction can be generalised as noted above. Also, it is possible to generalize the above to quadratic systems. A quadratic system is one in which at least one of the independent variables are of higher order than 1. Mirror bow is a second order effect such that correction requires non-linear modeling. Thus a quadratic equation is used. For example, for mirror bow, the error relates to a square of the error in a direction perpendicular to the mirror.

Experimental Results

The invention was tested using both I-line and DUV (deep ultraviolet) lithography to create alignment artifacts and to evaluate the effect of input corrections. I-line lithography was done using 0.80 μm OIR32HD resist coated on DNS80B tracks. Exposures were done on Canon I4/I5 steppers and development was also done on DNS80B tracks. DUV lithography utilized Canon EX4 steppers interfaced with DNS Dspin200 coat and develop tracks. Shipley UV5 resist coated 0.48 μm thick was used for DUV lithography. Alignment measurements were done using either KLA 5100 or KLA 5200 registration tools.

FIGS. 1a and 1b show distortion free calibration wafers fabricated by micro stepping over a complete wafer the centre die of a 5×5 reticle field. Each subfield contains all the required marks to align a second pattern to it.

A set of silicon calibration wafers was prepared as follows: An I5 stepper was adjusted to reduce scaling and orthogonality on bare silicon wafers within 0.1 ppm. The center die (5.247 mm×5.247 mm) of a 5×5 chip test reticle was stepped across the entire wafer by adjusting the aperture blades. This stepping distance was chosen since 5×5 die matched a same reticle opened to full field and stepped at 26.235 mm×26.235 mm increments. These wafers were developed and then etched to a depth of 800 Å into the silicon using a Lam® 9400 etcher from Lam Engineering®. The wafers were then stripped of resist. In this way, calibration wafers were fabricated with a first layer that was free of lens distortions. Twenty of these artifact wafers were then exposed on an EX4 using a duplicated fractional factorial design of input offsets shown in Table 5 with 3 center points. The design was augmented with four additional balanced runs done at the "edges" of the DOE (Design of Experiments) matrix with respect to chip rotation and x wafer rotation. Note that the range of variables that can be analyzed is broader than those offsets commonly encountered.

The values of the correctable factors were changed in the "Lot Run" screen as opposed to the corresponding "maintenance" entry. Following this process, a subset of runs was done to systematically determine whether the resulting alignment sign varied, depending on whether the value was provided to the "job entry" or "maintenance" screens.

The process or a subset thereof was then repeated on other steppers.

The above characterization process allows for determination of a response of a system to forced corrections when aligned to a near perfect distortion free grid. A complementary characterization process is to measure the resulting alignment to wafers with known offsets.

Figure 2:
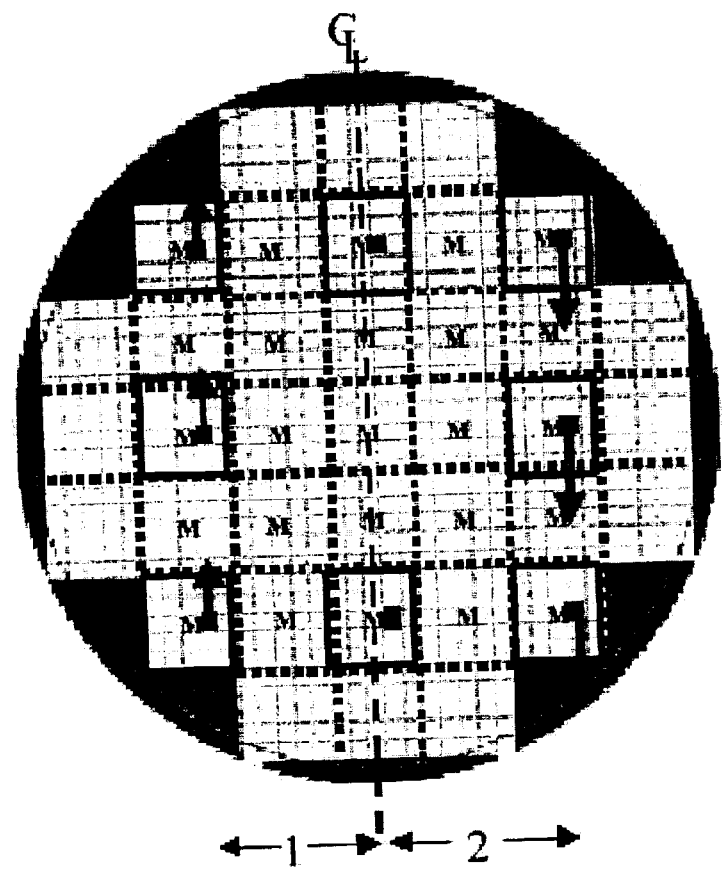
FIG. 2 shows eight highlighted die comprising an x wafer offset

The wafers were fabricated by micro stepping the same 5.247 mm×5.247 mm pattern as was used in the earlier process but individual die were shifted so that when they were aligned to, they comprised wafer offsets. With this approach, a second full-field masking layer is alignable to patterns with known offsets and measurable against unshifted die. For example, FIG. 2 shows how die are shiftable to cause a clockwise (−) x wafer rotation and measured against unshifted die (designated by M). In a similar fashion, a clockwise (+) x wafer rotation is created by reversing the direction of the shifted die; and indeed, all other wafer and chip offsets are created by properly shifting selected die.

Though in principle, any offset can be created by shifting a particular die by a determined amount; the EX4 software allows shift inputs in discrete increments of 0.01 μm that sometimes results in a round off error. To reduce round off error sites are chosen based on symmetry so as to minimize the number of discrete shifts. In the case shown in FIG. 2, the shifted sites are basically two different distances from the centerline of the wafer since die near the x-axis centerline require an insignificant amount of shifting. Alternatively, the offsets are chosen to reduce round off error. If round off is known for a particular system, it can be included in the model to ensure that correction values are selected to approximately optimize a resulting correction.

Figure 3:
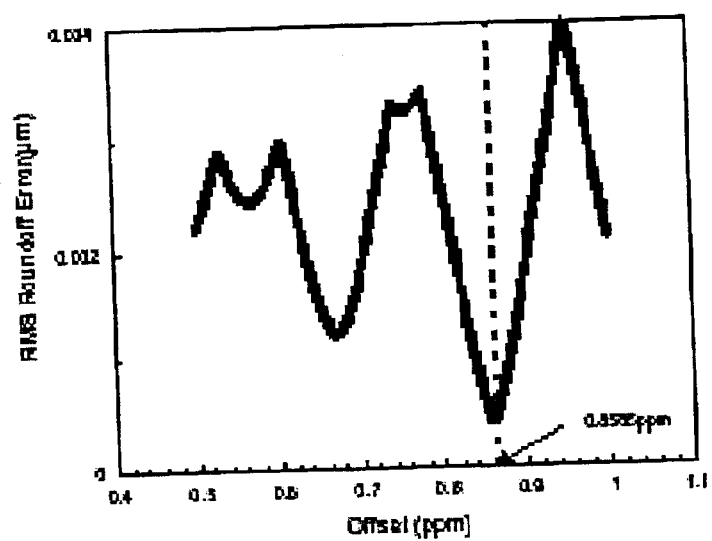
FIG. 3 is a graphical representation of a root mean square of the round off error as a function of offset.

FIG. 3 shows a graph of root mean square of the round off error as a function of offset. From the graph of FIG. 3 it is evident that ±0.8585 ppm offsets minimize the sum of the squares of the round off error for the specific case of shifting a 5.247 mm×5.247 mm die one site removed of center of the 5×5 field and two full fields from the center of the wafer (i.e. the case shown in FIG. 2). Ideally, to create wafer offsets of ±0.8585 ppm with 5.247 mm×5.247 mm die, shifts of ±0.0405 μm and ±0.0496 μm are required at the fields shown in FIG. 2. Rounding to ±0.04 μm and ±0.05 μm, respectively, causes a negligible error to uniformity of the resulting printed offset.

Figure 4:
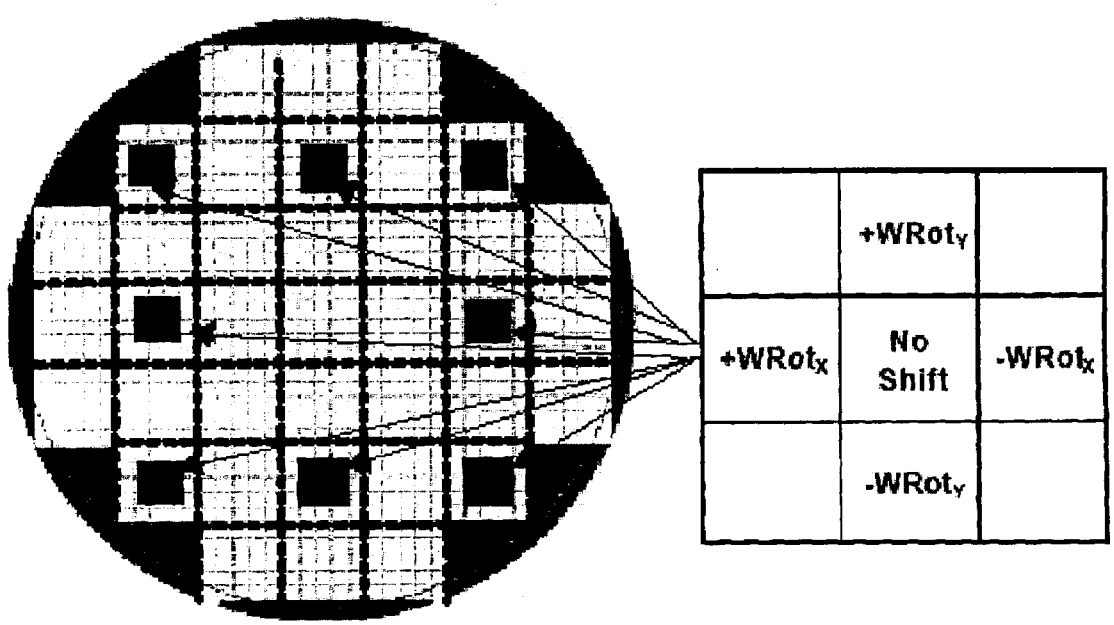
FIG. 4 is a layout representation of an arrangement of shifted die.

The eight highlighted die shown in FIG. 4 comprise an x wafer offset. If the second full field pattern is aligned to these eight die and measured at the unshifted "M" sites, then the effect of the wafer offset is quantifiable. Along the rotation axis (x), the shifted die are 3 distances from the wafer center vertical axis. The two die near this center line are virtually "on-axis" and do not require shifting. The three leftmost die require a smaller shift than the three right of center since they are closer to the center axis.

FIG. 4 shows an arrangement of the shifted die used to compose artifact wafers with ±0.8585 ppm x and y wafer rotation. Twelve bare silicon wafers were stepped with this pattern with DUV lithography. They underwent a 800 Å silicon etch, then the photo resist was stripped. The eight highlighted full fields shown in FIG. 2 were used for fine alignment. Four stepper jobs were written to align to die that created ±0.8585 ppm x and y wafer rotation as shown in FIG. 4. A fifth stepper job was created to align to the center of the field that was unshifted to serve as a control. Two wafers each were exposed with each stepper job. After stepping and developing, these 12 wafers were measured at the sites marked "M" in FIG. 2. None of these sites were shifted at first mask and are at the center of the field for the second masking.

Consequently, the effect of aligning to the shifted die is quantifiable against an ideal, distortion free grid.

Figure 5:
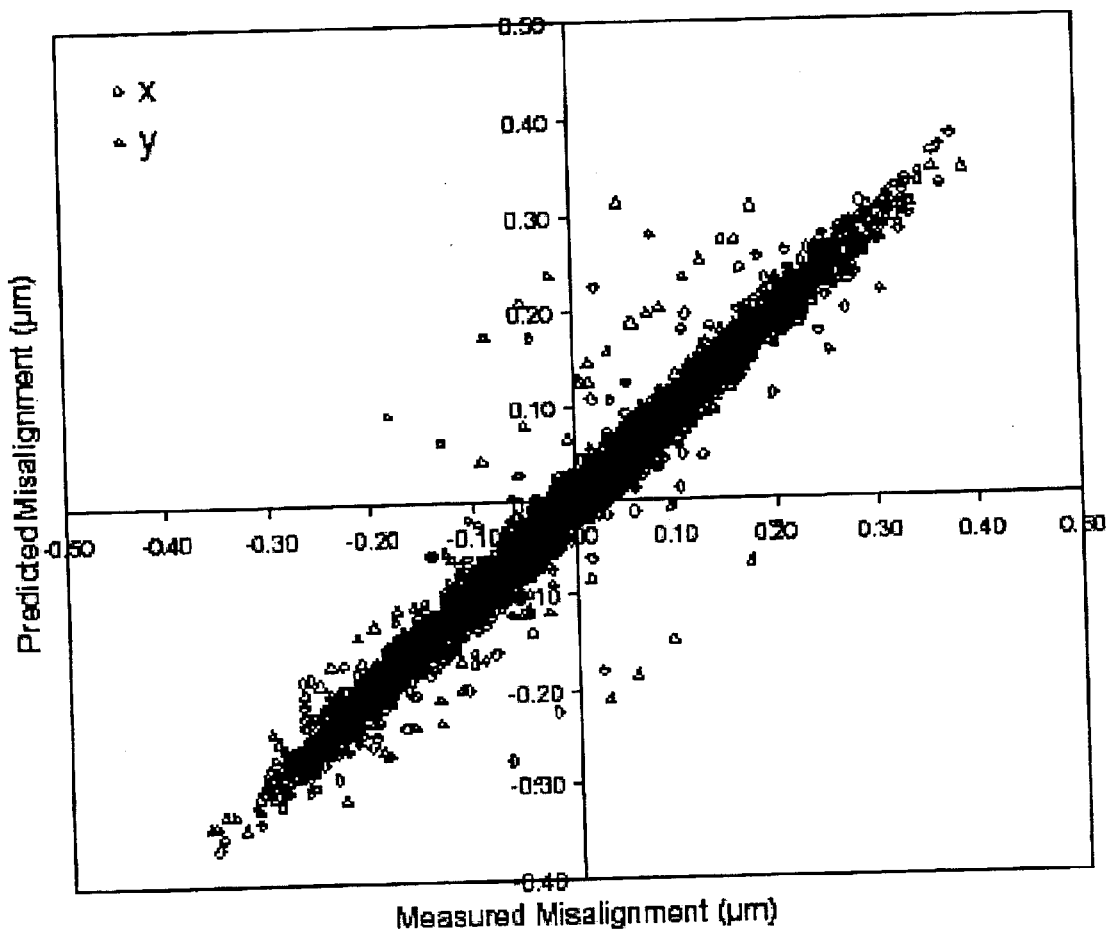
FIG. 5 is a graphical representation of the measured versus predicted misalignment for the Design of Experiments (DOE) shown in Table 2.

Alignment results for each run are measured and decomposed according to Eqs. 1a and 1b. To verify that the model is satisfactory, the predicted misalignments are calculated and compared to raw measurements. In FIG. 5 a correlation for the above experiment is shown. The average rms (root mean squared) deviation from the model was 0.02 $\mu$m for 2900 data points with an adjusted $r_2$ of 0.96. This lack of fit also includes stage and measurement reproducibility errors. Also, inspection of the raw data showed the vast majority of the outliers evident in FIG. 5 were from one of two outermost fields and were probably due to a stage or measurement anomaly.

After verifying the validity of the model, each component was regressed as a function of the forced correction and analyzed for response factors. The transformation matrix, T, was constructed from those factors that were statistically significant. Table 6 shows the transformation matrix for a Canon EX4 stepper. The diagonal components were close to unity but there were also several significant off diagonal elements. Most significant of these was that $R_{xWafRot}$ not only adjusted x axis wafer rotation but also chip rotation. The second largest off diagonal element was the effect that $R_{x0}$ had on $R_{yWafRot}$. However, since $R_{x0}$ is rarely greater than 0.10 $\mu$m, the additive effect on the resulting $R_{yWafRot}$ is at most 0.04 ppm, which is within the stage precision.

TABLE 5

| Correctable | Level Value | | |
|---|---|---|---|
| | − | 0 | + |
| $R_{x0}$, $R_{y0}$ ($\mu$m) | −.07 | 0 | +.07 |
| $R_{ChipMag}$ (ppm) | −4 | 0 | 4 |
| $R_{ChipRot}$ (ppm) | −4 | 0 | 4 |
| $R_{xWMag}$, $R_{yWMag}$ | −2 | 0 | 2 |
| $R_{xWRot}$, $R_{yWRot}$ | −2 | 0 | 2 |

Figure 6:
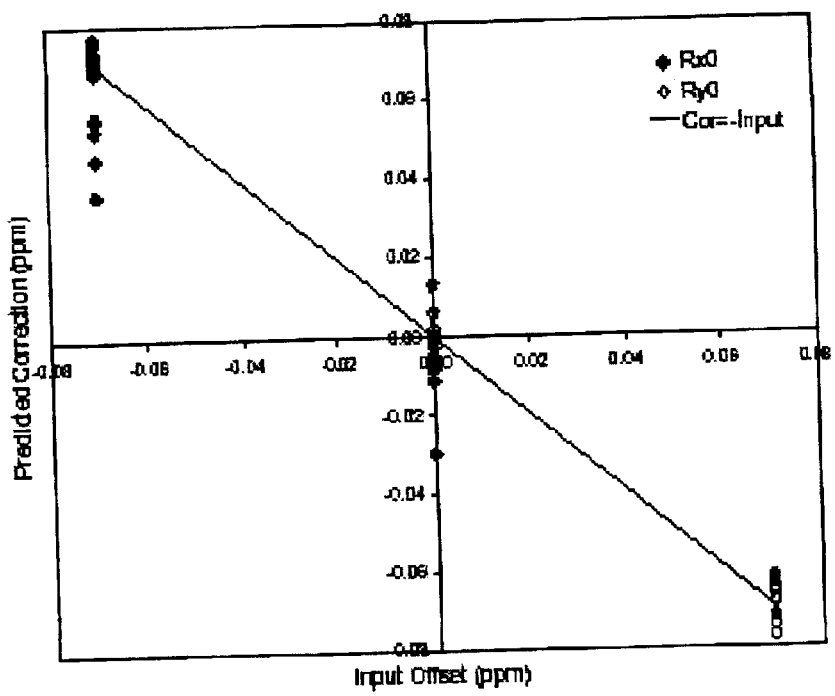
FIG. 6 is a graphical representation of the predicted translation correction versus input for DOE characterization runs.
Figure 7:
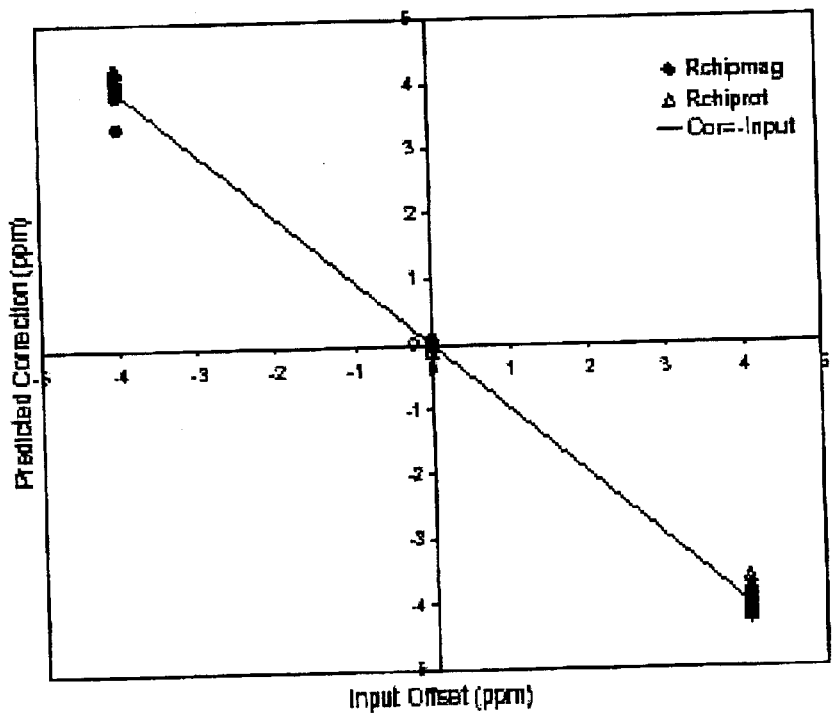
FIG. 7 is a graphical representation of the predicted chip magnification and rotation offset corrections versus input values for the DOE.
Figure 8:
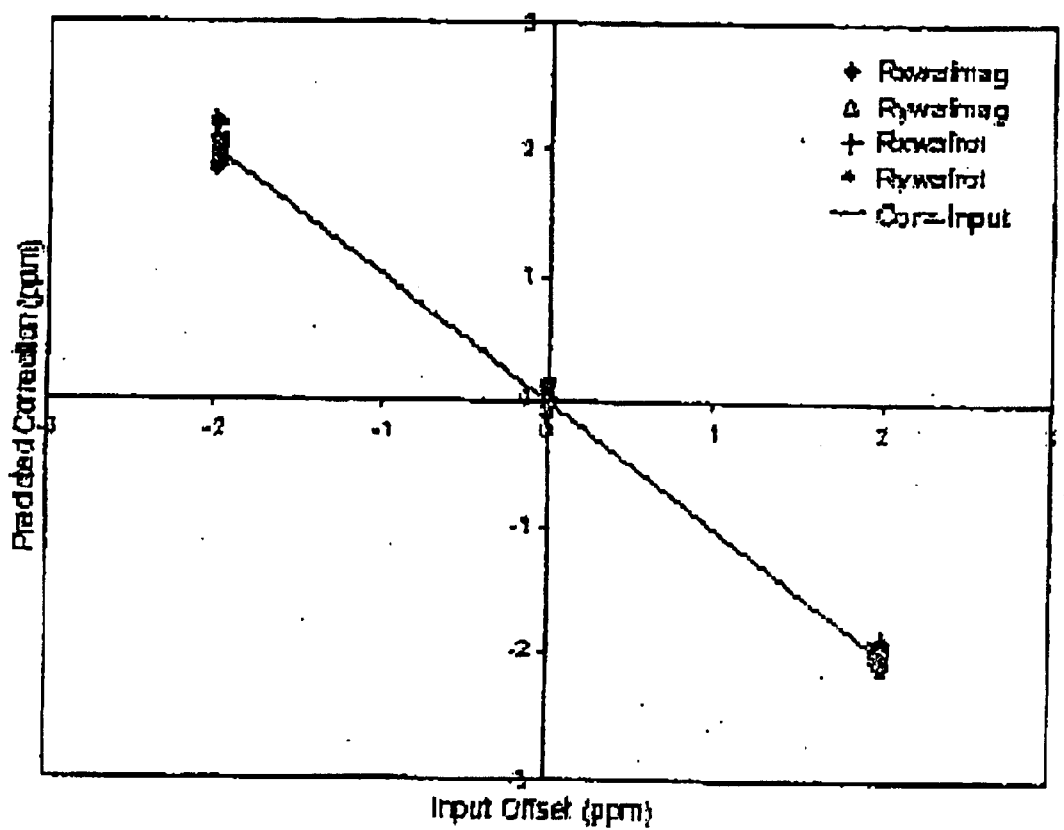
FIG. 8 is a graphical representation of the predicted wafer magnification and rotation corrections versus input values for the DOE characterization.

After determining T, Eq. 5 was used to calculate offsets for approximately zeroing out the forced inputs used in the DOE described in Table 5. FIGS. 6–8 show a comparison of calculated corrections and forced inputs for translation (FIG. 6), chip magnification and rotation (FIG. 7) and wafer offsets (FIG. 8). Table 7 summarizes the average deviations and estimated 3$\sigma$(between the actual input values and the predicted value to reverse its effect. Overall, the average deviations were quite small compared to the range of the forced corrections. From both FIG. 6 and Table 7 the 3$\sigma$ for correcting y translation is significantly smaller than x. This is not very surprising since our EX4 transverses the wafer horizontally and generally has less alignment variability in y than x. That said, with other equipment this result may differ.

TABLE 7

| Correction | Unit | Average | Residual 3$\sigma^{est}$ |
|---|---|---|---|
| $R_{x0}$ | $\mu$m | −0.01 | 0.039 |
| $R_{y0}$ | $\mu$m | 0.00 | 0.012 |
| $R_{ChipMag}$ | ppm | −0.06 | 0.463 |
| $R_{ChipRot}$ | ppm | 0.10 | 0.397 |
| $R_{xWafMag}$ | ppm | 0.00 | 0.254 |
| $R_{yWafMag}$ | ppm | 0.01 | 0.154 |
| $R_{xWafRot}$ | ppm | 0.03 | 0.129 |
| $R_{yWafRot}$ | ppm | −0.02 | 0.143 |

Subsets of the characterization DOE were run on another EX4 and an I4 stepper. Results from the other EX4 stepper confirmed the interaction between values input into $R_{xWRot}$ and resulting $R_{ChipRot}$. However, this was not true for the I4 stepper. Additionally, the I4 stepper showed differences in sign convention depending on whether certain corrections were entered into the lot run or a maintenance screen whereas the EX4 steppers did not. Also, the box in a box structure is used to measure alignment changes from layer to layer on real production lots due to design rules. Box-in-a-box refers to printing of a box during a current exposure onto a prior box that existed before the current exposure. The prior box may be an inside box or an outside box. Frame in a frame is also known. In frame in a frame, a frame is printed during a current exposure about or into a prior frame that existed before the current exposure. The prior frame may be an inside frame or an outside frame.

To incorporate these observations into a general model, an Excel macro was written to analyze raw alignment data in order to generate the corrections for any situations. The generalized form for obtaining correctable offsets is:

$$X^{input} = -(-1)^{nlayer} T_{stepper} I_{Typ} e X^{result} \tag{7}$$

Where:

nlayer is 2 when the aligned layer is inside the aligned to layer and 1 when it is outside;

$T_{stepper}$ is a stepper type dependent transformation matrix—Table 6 is the transformation matrix for EX4 steppers as set up in an example process; and, $I_{Type}$ is a diagonal matrix composed of ±1 and accounts for sign convention differences between inputs added to the job run versus maintenance input screens.

For example, at a poly layer an inside box is the printed layer and an outside is the prior layer. The metal layer has opposite settings (so metal covers oxide completely). Therefore signs change between these layers. The above equation facilitates understanding of this and implementation thereof. A simpler implementation uses a lookup table to define sign conventions of different layers.

TABLE 6

| Results | Inputs | | | | | | | |
|---|---|---|---|---|---|---|---|---|
| | $R_{x0}$ | $R_{y0}$ | $R_{ChipMag}$ | $R_{ChipRot}$ | $R_{xWafMag}$ | $R_{yWafMag}$ | $R_{xWafRot}$ | $R_{yWafRot}$ |
| $R_{x0}$ | 1.01 | 0.00 | 0.00 | 0.00 | 0.00 | 0.00 | 0.00 | 0.00 |
| $R_{y0}$ | 0.00 | 1.01 | 0.00 | 0.00 | 0.00 | 0.00 | 0.00 | 0.00 |
| $R_{ChipMag}$ | 0.00 | 0.00 | 0.91 | 0.00 | −0.04 | −0.04 | 0.06 | 0.00 |
| $R_{ChipRot}$ | 0.00 | 0.00 | 0.03 | 0.96 | −0.04 | 0.00 | 0.93 | 0.00 |
| $R_{xWafMag}$ | 0.00 | 0.00 | −0.04 | 0.00 | 0.96 | 0.00 | −0.02 | 0.00 |
| $R_{yWafMag}$ | 0.00 | 0.00 | 0.00 | 0.00 | 0.00 | 1.01 | 0.00 | 0.01 |
| $R_{xWafRot}$ | 0.00 | 0.00 | 0.00 | −0.03 | 0.00 | 0.00 | 0.95 | 0.00 |
| $R_{yWafRot}$ | 0.37 | 0.00 | 0.00 | 0.00 | 0.00 | 0.00 | 0.00 | 1.00 |

It is often sufficient to use a common transformation matrix for a given stepper family. In fact, the only difference between $T_{EX4}$ and $T_{I4/5}$ is that the effect of $R_{xWafRot}$ on $R_{ChipRot}$ is set to 0 for the latter case.

Table 8 summarizes measurements of unshifted die on wafers aligned to x and y shifted sites to simulate ±0.8585 ppm wafer rotations. As the nominal x wafer rotation changes from −0.8585 ppm to 0.8585 ppm the measured x wafer rotation on unshifted die changed from −0.75 ppm to 0.85 ppm as expected. However, chip rotation also changed from −0.02 to 1.43 ppm. The average measured response to aligning to sites with an x wafer rotation of ±0.8585 ppm was 0.80 ppm in $R_{xWafRot}$ and ±0.72 ppm in $R_{ChipRot}$. In fact, the ratio of the measured responses to the nominal input value shifts agrees extremely well with the respective values in $TEX_{EX4}$ determined from the forced input DOE. The results shown in Table 8 were obtained with a different EX4 stepper than the one used to find $T_{EX4}$. Thus, so long as inter-device variation is small, a same transformation matrix is usable with different machines. Second, the agreement shown in Table 9 between the respective normalized response and $T_{EX4}$ is within 2 nm for the field and wafer sizes in this investigation. This obviously is well within the metrology and stage reproducibility errors.

Results from aligning to shifted die corroborate the observation that the stage compensation algorithm couples x wafer rotation with chip rotation. This is true whether the aligned layer has an x wafer rotation or whether the aligning layer induces the rotation.

Results such as those shown in Tables 8 and 9 demonstrate the use of these fixed offset calibration wafers to quantify stage responses. The same strategy is useful to quantify individual stepper responses to wafer magnification and stepper field offsets. In principle, such wafers are useful for generation of the transformation matrix and for quantifying stage effectiveness of stepper alignment strategies.

For many steppers, there are other adjustable parameters available through installation or maintenance input screens. Scanners, as an example, typically have additional terms to describe scan yaw and scan magnification. The invention is applicable with these further parameters as well.

Preferably, a model is verified prior to use. Verification of a model allows for correction and model modification prior to manufacturing. This prevents manufacturing based on a model that is less than complete or, worse, flawed. Optionally, fewer correctables are employed than those available.

After a model is verified, a series of calibration processes are performed to determine a transformation matrix, T, for a particular stepper. And though the process described above concerns first order effects, it is possible to apply the invention to correction of nonlinear and/or higher order interactions if needed or if tolerances demand more accuracy.

Composition of the transformation matrix, T, offers insight into the response of a particular stepper towards misalignment and input corrections. Diagonal elements in T that vary from unity indicate that the respective response is not one to one with the input correction. X wafer rotation observed for two EX4 steppers is one example. Deviations from unity for diagonal elements also suggest anon-optimal

TABLE 8

| Wafer Rotation Axis | Target Feature Rotation (ppm) | Resulting Alignment Components | | | | | | | |
|---|---|---|---|---|---|---|---|---|---|
| | | $R_{x0}$ (μm) | $R_{y0}$ (μm) | $R_{ChipMag}$ (ppm) | $R_{ChipRot}$ (ppm) | $R_{xWafMag}$ (ppm) | $R_{yWafMag}$ (ppm) | $R_{xWafRot}$ (ppm) | $R_{yWafRot}$ (ppm) |
| x | −0.85 | 0.03 | −0.02 | −0.42 | −0.02 | 0.06 | −0.10 | −0.75 | −0.03 |
| | 0 | 0.01 | −0.01 | −0.46 | 0.69 | 0.03 | −0.15 | 0.03 | −0.11 |
| | 0.85 | 0.02 | −0.01 | −0.31 | 1.43 | 0.07 | −0.15 | 0.85 | −0.07 |
| | ±Response | 0.00 | 0.00 | 0.06 | 0.72 | 0.01 | −0.03 | 0.80 | −0.02 |
| y | −0.85 | 0.02 | −0.01 | −0.37 | 0.74 | 0.13 | −0.14 | 0.03 | −0.91 |
| | 0 | 0.01 | −0.01 | −0.46 | 0.69 | 0.03 | −0.15 | 0.03 | −0.11 |
| | 0.85 | 0.01 | −0.01 | −0.39 | 0.67 | 0.01 | −0.14 | −0.02 | 0.77 |
| | ±Response | −0.01 | 0.00 | −0.01 | −0.04 | −0.06 | 0.00 | −0.03 | 0.84 |

TABLE 9

| Wafer Rotation Axis | Alignment Component | ±Average Response (ppm) | ±Normalized Response | $T_{EX4}$ Component |
|---|---|---|---|---|
| x | $R_{ChipRot}$ | 0.72 | 0.84 | 0.93 |
| | $R_{xWafRot}$ | 0.80 | 0.93 | 0.95 |
| y | $R_{ChipRot}$ | −0.04 | −0.04 | 0.00 |
| | $R_{xWafRot}$ | 0.84 | 0.98 | 1.00 | stepper installation or setup. The method outlined herein is also capable of compensating for these setup errors provided they are approximately constant and that the transformation matrix is recalculated when necessary, for example on a periodic basis.

Often, the general method described by Eqs. 5 and 6 is capable of generating offsets that compensate for the effect of one correction on another. However, corrections causing other errors are often a bewildering source of apparent random error. Consider for example the effect that $R_{xWafRot}$ has on $R_{ChipRot}$ for the EX4 steppers. Each time the stepper performs an x wafer rotation, it also rotates the field. Since it is common to automatically compensate for wafer rotation in a production environment, the user is not aware of the magnitude of correction required to compensate $R_{xWafRot}$ but measures the induced chip rotation. Consequently, chip rotation is likely to fluctuate with incoming material more than other parameters simply because it is coupled to a wafer condition that is automatically compensated for. A trend chart tracking $R_{ChipRot}$ could imply that effort is required to stabilize chip rotation rather than the real problem of variation in x wafer rotation for a prior masking layer.

Of course, accounting for these concerns in the model allows for better modeling, better error correction values, and so forth. Though that is the case, this still leaves some errors which are automatically compensated for as variables in a manufacturing environment.

While the invention has been described particularly with respect to substrates comprising semiconductor wafers, it is possible to apply the invention to other forms of substrates where multiple positioning corrections are necessary. It is applicable wherever multiple positioning corrections are applied to a member.

What is claimed is:

1. A method for improving alignment of a substrate on a stepper comprising the steps of:
   providing to the stepper a first forced correction value indicative of a stepper alignment error;
   aligning the stepper in accordance with the first forced correction value;
   measuring a set of at least an actual correction resulting from a forced correction to the stepper responsive to the first forced correction value; and
   mathematically processing the set of the at least an actual correction and the first forced correction value to determine a transform for use in transforming an other forced correction value to a resulting forced correction value for producing an actual correction of stepper alignment more related to the other forced correction value.

2. A method for improving alignment of a substrate on a stepper according to claim 1 wherein the transform is a matrix.

3. A method for improving alignment of a substrate on a stepper according to claim 2 wherein elements within the matrix and along a first diagonal thereof are for transforming error within a single measurable parameter of stepper alignment.

4. A method for improving alignment of a substrate on a stepper according to claim 3 wherein elements within the matrix and other than along the first diagonal are for transforming error within two different measurable parameter of stepper alignment.

5. A method for improving alignment of a substrate on a stepper according to claim 3 wherein the matrix corrects for errors in steeper alignment actions in response to a first forced correction value.

6. A method for improving alignment of a substrate on a stepper according to claim 2 wherein elements within the matrix and other than along the first diagonal are for transforming error within two different measurable parameter of stepper alignment.

7. A method for improving alignment of a substrate on a stepper according to claim 6 wherein the matrix corrects for errors resulting in measurable parameters other than the measurable parameter within which the forced correction is applied.

8. A method for manufacturing a semiconductor device comprising the steps of:
   imposing a predetermined correction to a stepper far each of a plurality of substrates;
   measuring an actual correction resulting from the imposed predetermined correction for each of the plurality of substrates;
   mathematically processing a set of the actual corrections to produce a response matrix for providing a plurality of equations;
   solving the plurality of equations to obtain a set of input corrections to provide data relating to a correct alignment of a substrate on said stepper;
   providing the data to the stepper in order to improve alignment thereof; and
   manufacturing a semiconductor device on the stepper having said improved alignment.

9. A semiconductor device formed by the method of:
   imposing a predetermined correction to a stepper for each of a plurality of substrates;
   measuring an actual correction resulting from the imposed predetermined correction for each of the plurality of substrates;
   mathematically processing a set of the actual corrections to produce a response matrix for providing a plurality of equations;
   solving the plurality of equations to obtain a set of input corrections to provide data relating to a correct alignment of a substrate on said stepper;
   providing the data to the stepper in order to improve alignment thereof; and
   manufacturing the semiconductor device on the stepper having said improved alignment.

* * * * *